United States Patent [19]

Imai et al.

[11] Patent Number: 5,053,300
[45] Date of Patent: Oct. 1, 1991

[54] DISPLAY AND PROCESS FOR PRODUCTION FOR PRODUCTION THEREOF

[75] Inventors: Takeshi Imai, Ohbu; Teruhiko Iwase, Kariya; Toshio Koura, Nagoya; Minoru Maeda, Minami-Ashigara; Junichi Fujimori, Minami-Ashigara; Fumiaki Shinozaki, Minami-Ashigara, all of Japan

[73] Assignees: Fuji Photo Film Co., Ltd., Kanagawa; Nippondenso Co., Ltd., Aichi, both of Japan

[21] Appl. No.: 590,273

[22] Filed: Sep. 28, 1990

[30] Foreign Application Priority Data

Sep. 29, 1989 [JP] Japan ................................. 1-254209

[51] Int. Cl.⁵ .......................... G03C 11/12; G03C 1/90
[52] U.S. Cl. .......................................... 430/15; 430/14; 430/257; 430/258; 430/260
[58] Field of Search ................................ 430/256–260, 430/262, 263, 14, 15

[56] References Cited

U.S. PATENT DOCUMENTS 4,482,625 11/1984 Namiki et al. ...................... 430/257
4,766,053 8/1988 Shinozaki et al. .................. 430/257
4,933,258 6/1990 Shinozaki et al. .................. 430/260

Primary Examiner—Richard L. Schilling
Attorney, Agent, or Firm—Sughrue, Mion, Zinn, Macpeak & Seas

[57] ABSTRACT

A display such as meter panel and advertising display comprises a color image forming layer provided on a light-transmitting permanent support via a photo-polymerizable adhesive layer, and a photo-polymerizable image-receiving layer closely adhered to the color image forming layer. The display can be effectively produced by a process comprising the steps of forming a color image on a photo-polymerizable image-receiving layer of a photosensitive image-receiving material, placing it upon a photo-polymerizable adhesive layer formed on a light-transmitting permanent support to form a laminate so that the photo-polymerizable image-receiving layer and the photo-polymerizable adhesive layer face each other and then exposing the laminate to light so as to closely adhere the photo-polymerizable image-receiving layer and the photo-polymerizable adhesive layer to their adjacent layers, respectively, by the photo-polymerization. By this method, the adhesion between the photo-polymerizable image-receiving layer and the light-transmitting permanent support is improved.

18 Claims, 1 Drawing Sheet

DISPLAY AND PROCESS FOR PRODUCTION FOR PRODUCTION THEREOF

BACKGROUND OF THE INVENTION

The present invention relates to displays such as meter panels of automobiles and advertising displays and a process for production thereof.

Meter panels are usually produced by repeated screen printing method using plastic plates such as polycarbonate resin, acrylic resin and polyvinyl chloride resin plates. In this process, the screen printing must be repeated many times which are the same as the variety of the colors for forming multi-color images. Accordingly, a great deal of labor and time are necessitated for the toning by mixing inks and tuning up of the screen printing machine.

A process wherein an image-forming material having a color photosensitive composition layer is exposed and developed to form a color image and then it is transferred onto a support is well known from, for example. Japanese Patent Publication for Opposition Purpose (hereinafter referred to as "J. P. KOKOKU") Nos. 46-15326 and 49-441 and Japanese Patent Unexamined Published Application (hereinafter referred to as 'J. P. KOKAI') Nos. 47-41830 and 51-5101. However, this process has defects in that it is troublesome, since an adhesive is used at each time of the transfer, that the conformity of the position in the transfer of the color image is difficult and that the final image is seen reversed from right to left.

J. P. KOKAI No. 59-97140 discloses a process for overcoming the above-described defects wherein the image of each color is transferred onto an image-receiving sheet having a photo-polymerizable image-receiving layer prior to the transfer of the image of each color onto the permanent support, then the image is transferred onto the permanent support and the photo-polymerizable receiving layer is fixed by the whole image exposure. Although this process is effective for the production of color-proofing printing sheets, it has defects when it is employed for the production of meter panels. Namely, the defects are that the reliability thereof is unsatisfactory, since the adhesion to the permanent support is insufficient and the layer is peeled off from the support or it expands during the production steps or storage at a high temperature and at a high humidity.

In particular, meter dial plates of automobils can be used not only under the severe condition, for example, requiring heat-resistance, light-resistance, and temperature change-resistance, but also have to retain the physical resistance for cutting the plate so as to incorporate it into meter case, drilling apertures for providing with indicators or fixing with bolts. However, many meter dial plates are prepared by the conventional screen-printing method, so that the thus prepared multicolor printed surface thereof is not sufficient for high-grade and colored meter dial plates. Therefore, it has been required to develop the technique for preparing the full colored plates having high image strength, high density and high resolving power.

SUMMARY OF THE INVENTION

A primary object of the present invention is to provide a display in which the adhesion between the photo-polymerizable image-receiving layer having a color image formed thereon and the light-transmitting permanent support is improved.

Other object of the present invention is to provide a process for preparing a display in which the adhesion between the photo-polymerizable image-receiving layer having a color image formed thereon and the light-transmitting permanent support is improved by the transfer of a color image.

These and other objects of the present invention will be apparent from the following description and Examples.

The object of the present invention is attained by a display comprising a color image forming layer provided on a light transmitting permanent suppot via a photo-polymerizable adhesive layer, and a photo-polymerizable image-receiving layer closely adhered to the color image forming layer.

Another aspect of the present invention is also attained by a process for producing the display comprising the steps of forming a color image on a photo-polymerizable image-receiving layer of a photosensitive image-receiving material, placing the material upon a photo-polymerizable adhesive layer formed on a light-transmitting permanent support to form a laminate so that the photo-polymerizable image-receiving layer and the photo-polymerizable adhesive layer face each other and then exposing the laminate to light so as to closely adhere the photo-polymerizable image-receiving layer and the photo-polymerizable adhesive layer to their adjacent layers, respectively, by the photo-polymerization.

DESCRIPTION OF THE PREFERRED EMBODIMENTS

Figure 1:
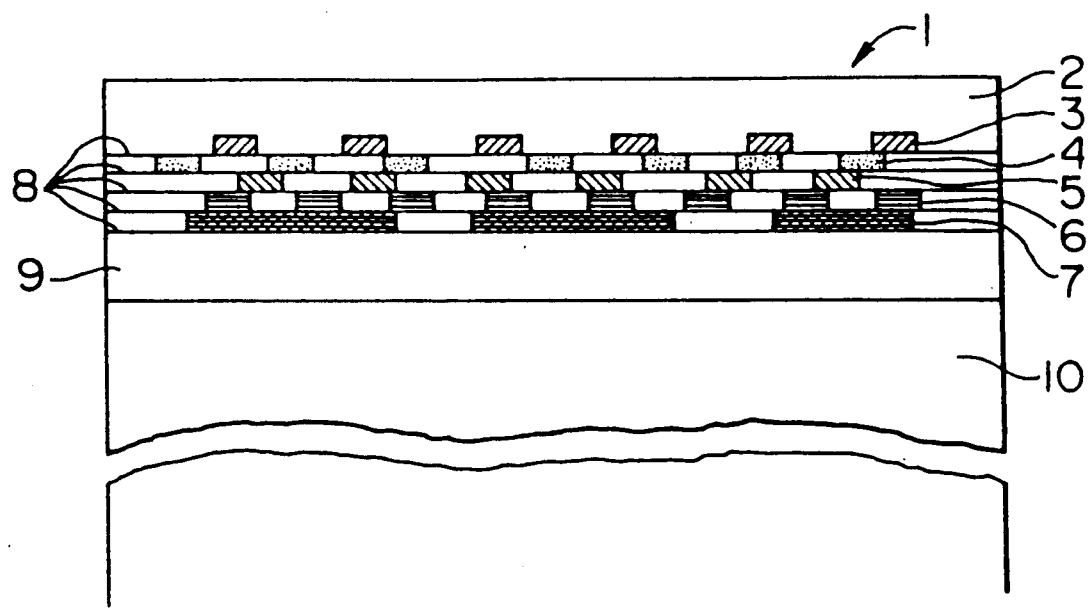
FIG. 1 shows a vertical cross-sectional view of meter panel of the present invention.

The photo-polymerizable adhesive layer of the present invention may be made of either a liquid photo-polymerizable adhesive or dry film-type photo-polymerizable adhesive. From the viewpoint of simplification of the process, the dry film-type photo-polymerizable adhesive is preferred.

The photo-polymerizable composition layer made of the dry film-type photo-polymerizable adhesive comprises:

a) a non-gaseous ethylenically unsaturated compound having at least one ethylenically unsaturated group and capable of forming a polymer in the presence of a photo-polymerization initiator, b) a thermoplastic organic polymer binder, and c) a photo-polymerization initiator or initiator system which is activated by activating rays, and, if necessary, it may contain a heat polymerization inhibitor.

The non-gaseous ethylenically unsaturated compounds usable in the present invention include compounds described in J. P. KOKOKU Nos. 35-5093, 35-14719 and 44-28727 and J.P. KOKAI No. 59-113423. Preferred examples of them include acrylic or methacrylic acid polyesters of polyhydric alcohols such as ethylene glycol, propylene glycol, polyethylene glycol, polypropylene glycol, 1,5-pentanediol, neopentyl glycol, 1,6-hexanediol, trimethylolpropane, pentaerythritol and dipentaerythritol.

The thermoplastic organic polymer binders are particularly preferably vinyl or acrylic polymers from the viewpoint of the compatibility with the above-described ethylenically unsaturated compound and photo-polymerization initiator. Examples of these polymers include polyvinyl chloride, polyacrylic acid, polymethyl acrylate, polyethyl acrylate, polybutyl acrylate, polymethacrylic acid, polymethyl methacrylate, polybutyl methacrylate, polyvinyl acetate, polyvinyl ether, polyvinyl acetal and copolymers of them.

The suitable mixing ratio of the ethylenically unsaturated compound to the thermoplastic organic polymer binder varies depending on the combination of them used. Usually the weight ratio of the unsaturated compound to the binder is 0.1:1.0 to 2.0:1.0.

The photo-polymerization initiators are preferably those having a low light absorption in the visible ray region such as aromatic ketones, e.g. benzophenone, Michler's ketone, 4,4'-bis(diethylamino)benzophenone, 4-methoxy-4'-dimethylaminobenzophenone, 2-ethylanthraquinone and phenanthraquinone; benzoins, e.g. benzoin per se methylbenzoin and ethylbenzoin; benzoin ethers, e.g. benzoin methyl ether and benzoin ethyl ether; and Z-(o-chlorophenyl)-4,5-diphenylimidazole dimer, 2-(o-methoxyphenyl)-4,5-diphenylimidazole dimer and 2,4,5-triarylimidazole dimers described in U.S. Pat. Nos. 3,479,185 and 3,784,557.

The amount of the photo-polymerization initiator is preferably 0.01 to 20.0% by weight based on the unsaturated compound.

Examples of the heat-polymerization inhibitors include p-methoxyphenol, hydroquinone, t-butylcatechol, pyrogallol and phenothiazine.

It is preferred that the dry film-type photo-polymerizable adhesive used in the present invention is kept on a temporary support by adhesion thereto prior to the adhesion to the photo-transmitting permanent support. The temporary supports are preferably flexible ones such as plastic films, e.g. polyethylene terephthalate, polystyrene, polyvinyl chloride, polycarbonate, cellulose nitrate and cellulose acetate films, as well as papers having a baryta layer or organic polymer (such as polyethylene or styrene/butene copolymer) layer formed thereon by coating or lamination.

The liquid photo-polymerizable adhesive is preferably a solventless composition containing the above-described ethylenically unsaturated compound and photo-polymerization initiator as the main components.

The thickness of the adhesive layer may be enough for laminating the image transferred onto the image-receiving material and the permanent support together without formation of any bubbles therein. It is preferably 2.0 to 50.0 μm.

The display of the present invention can be produced more effectively by the process comprising the following steps (a) to (f):

(a) image-exposing a photosensitive image-forming material through a color separation mask, the photosensitive image-forming material comprising, on a support, (1) a photosensitive colored composition containing a dye or pigment or (2) a laminate of a color material layer containing a dye or pigment and a photosensitive resist layer, wherein the layer (1) or (2) is directly formed on the support or formed on the support via a peel layer, (b) developing the image-exposed photosensitive image-forming material to form a color image on the support.

(c) transferring the color image onto the photo-polymerizable image-receiving layer of the image-receiving material, (d) transferring at least one more color image having a different color formed in the same manner as that of the above step (a) or (b) onto the photo-polymerizable image-receiving layer in conformity to each other, (e) transferring the multi-color image formed on the image-receiving layer onto the light-transmitting permanent support having the photo-polymerizable adhesive layer, and (f) photo-polymerizing the photo-polymerizable image-receiving layer on the image-receiving material and the photo-polymerizable adhesive layer on the light-transmitting permanent support by exposure to light so as to bond each other.

The process for producing the display with the dry film-type photo-polymerizable adhesive will be described in detail below in due order:

1) The separated image of the first color obtained after the development is directly superposed on the photo-polymerizable image-receiving layer of the image-receiving material and they are passed through a laminator under heating and pressure. The separated image is transferred to the photo-polymerizable image-receiving layer in such a state that the image is formed on the layer by the heat and pressure applied thereto during the passage.

2) The second, third, ... separated images as necessitated are successively conformed to the image of the first color and then the transfer is conducted in the same manner as above to form a multi-color separated image on the photo-polymerizable image-receiving layer.

3) On the other hand, the photo-polymerizable composition layer of the above-described dry film-type photo-polymerizable adhesive is directly superposed on the light-transmitting permanent support and they are passed through the laminator under heating and pressure to adhere the photo-polymerizable adhesive layer to the light-transmitting permanent support.

4) Then the photo-polymerizable image-receiving layer having the multi-color separated image transferred thereto is directly superposed on the photo-polymerizable adhesive layer on the above-described light-transmitting permanent support and they are passed through the laminator under heating and pressure to adhere the photo-polymerizable image-receiving layer having the multi-color separated image transferred thereonto to the light-transmitting permanent support.

5) It is wholly irradiated with U.V. rays through the transparent support for the photo-polymerizable image-receiving layer and the light-transmitting permanent support to thermoset the photo-polymerizable adhesive layer and the photo-polymerizable image-receiving layer.

6) The transparent support for the photo-polymerizable image-receiving layer is peeled off to obtain the conformed separated image having an excellent adhesion which has been transferred onto the light-transmitting permanent support. In this process, the transparent support may not be peeled off.

The color image used in the present invention may be (1) an image formed by coating a photosensitive image-forming material on the support directly or via a peel layer and image-exposure of the photosensitive image-forming material followed by the development, (2) an image formed on a releasable temporary support by, for example, printing or (3) an image formed by cutting a colored film on the releasable temporary support. Among them, the image formed by image-exposing the photosensitive image-forming material followed by the development is preferred. From the viewpoint of the transfer of the colored image onto the photo-polymerizable image-receiving layer, the thickness of the colored image is preferably 0.5 to 15 μm.

The photosensitive image-forming materials used in the present invention may be of either positive working type or negative working type. They are preferably those developable with an aqueous alkaline solution. They include the photosensitive image-forming materials described in J. P. KOKAI Nos. 59-97140, 61-188537, 61-213843, 62-63930, 62-67529, 62-227140, 63-2038, 63-2039 and 63-2040.

From the viewpoint of the observation of the image with the transmitted light, the optical density of at least one of the photosensitive image-forming materials is preferably about 1.2 or higher, more preferably about 1.2 to about 3.5 in case of determining the density by Macbeth TD-904 (a product of Macbeth Co.). A white image-forming material can be used in order to diffuse the transmitted light. The optical density of the white image-forming material may be 1.2 or less.

As the material to form the peel layer, there can be used the conventional material which is known to form the layer. Examples of the material include alcohol-soluble polyamide, hydroxystyrene polymer, polyvinyl acetate, poly(metha)acrylate, polyvinyl chloride, polyvinyl butylate, methylmethacrylateacrylate copolymer, cellulose acetate butylate, vinylchloridevinylacetate copolymer, cellulose diacetate, cellulose triacetate, blends of partially esterified resin of styrenemaleic anhydride copolymer and methoxymethyl nylon and the like. The thickness of the peel layer is not particularly limited, but is preferably 0.1~20μ, more preferably 0.2~5μ. In some cases of using the peel layer, a part of the peel layer under the dot image remaines undeveloped after the development and the image is adhered to the support via the part of the peel layer, while the other part of the peel layer not positioned under the dot image is dissolved off by the development. In other cases, the whole of the peel layer remaines undissolved off by the development and the dot image is formed on the peel layer adhered to the support.

The photo-polymerizable image-receiving materials usable in the present invention are those described in J. P. KOKAI Nos. 59-97140, 61-189535, 61-200535 and 63-2037. In particular, examples of the photo-polymerizable image-receiving materials include materials in which the following composition comprising (1) to (3) is formed on a support:

(1) a non-gaseous ethylenically unsaturated compound having at least one ethylenically unsaturated group and capable of forming a polymer in the presence of a photo-polymerization initiator, (2) an organic polymer binder, and (3) a photo-polymerization initiator which is activated with activating rays.

If necessary, they can contain a heat polymerization inhibitor. More particularly, those described in J. P. KOKAI No. 59-97140 (from the right lower column, page 3 to left lower column, page 4) are usable. The composition of the photo-polymerizable image-receiving material may also be the same as that of the photo-polymerizable adhesive layer. Although the thickness of the photo-polymerizable image-receiving layer is not particularly limited, it is preferably 4 g/m² to 40 g/m².

The light-transmitting permanent support used in the present invention is preferably a rigid plastic plate, particularly rigid transparent plastic plate such as a polycarbonate plate, acrylic resin plate or polyvinyl chloride plate. Although the thickness of the plate is not particularly limited, it is usually 0.1 to 5 mm.

According to the present invention, letters, figures, signs and the like formed on the photo-polymerizable image receiving layer can be seen directly through the image-receiving layer or the permanent support, so that the displays of the present invention can be widely utilized as meter panels for automobiles and trains as well as advertising displays and display signs. In particular, since the colored images are formed between the image receiving layer and the photopolymerizable adhesive layer, the displays of the present invention have high strenght, good heat-resistance and light-resistance together with good physical resistance for fixing with bolts.

Furthermore, according to the process of the present invention, colored separated images can be formed by not a screen printing process but a photographic process (pattern exposure and development) and a multicolor image can be formed by merely superposition of the separated images of the respective colors. Therefore, not only the steps of production of the displays can be shortened but also the adhesion of the photo-polymerizable image-receiving layer having the multi-color separated image transferred thereonto to the light-transmitting permanent support is improved. As a result, the peeling-off or expansion is not caused during the process or storage at a high temperature and at a high humidity. Thus the displays having a high reliability can be produced by the simple process.

The following Examples will further illustrate the present invention, which by no means limit the invention.

EXAMPLE 1

A coating liquid having the following composition was applied to a polyethylene terephthalate film having a thickness of 25 μm and then dried to form an adhesive sheet having a photo-polymerizable adhesive layer having a thickness of 10 μm (on dry basis).

| Photo-polymerizable adhesive layer-forming coating liquid: | |
|---|---|
| Polymethyl methacrylate (average molecular weight: 100,000; a product of Wako Jun'yaku Co., Ltd.) | 90.0 g |
| Tetraethylene glycol diacrylate | 40.0 g |
| Trimethylolpropane triacrylate | 10.0 g |
| Michler's ketone | 0.3 g |
| Benzophenone | 1.8 g |
| Hydroquinone monomethyl ether | 0.1 g |
| Methyl ethyl ketone | 220.0 g |

On the other hand, a coating liquid having the following composition was applied to a polyethylene terephthalate film having a thickness of 100 μm and then dried to form an image-receiving material having a photo-polymerizable image-receiving layer having a thickness of 25 μm (on dry basis).

| Photo-polymerizable image-receiving layer-forming coating liquid: | |
|---|---|
| Poly(methyl methacrylate/methacrylic | 90.0 g |

-continued

| Photo-polymerizable image-receiving layer-forming coating liquid: | |
| --- | --- |
| acid) (90/10; average molecular weight: 70,000) | |
| Pentaerythritol tetraacrylate | 50.0 g |
| Michler's ketone | 0.3 g |
| Benzophenone | 1.8 g |
| Hydroquinone monomethyl ether | 0.1 g |
| Methyl ethyl ketone | 220.0 g |

On the other hand, an image-forming material comprising a peel layer, color photosensitive resin layer and protecting layer on a polyethylene terephthalate film having a thickness of 100 μm was prepared as described below.

A coating liquid for forming the peel layer having the following composition was applied to the support and then dried to form a peel layer having a thickness of 0.5 μm (on dry basis).

| Coating liquid for forming peel layer: | |
| --- | --- |
| Alcohol-soluble polyamide (CM-8000; a product of Toray Industries, Inc.) having η of 23 cps (20° C., 10 wt. % methanol solution) | 7.2 g |
| Polyhydroxystyrene (Resin M, a product of Maruzen Oil Co., Ltd.) (average molecular weight: 5500) | 1.8 g |
| Methanol | 400.0 g |
| Methyl cellosolve | 100.0 g |

Four color photosensitive solutions, i.e. yellow (Y), magenta (M), cyan (C) and black (B), having compositions shown in Table 1 were applied to four film supports having a peel layer, respectively, to form color photosensitive resin layers having a thickness of about 3 μm (on dry basis).

The optical densities of the four color photosensitive resin layers thus formed were as shown in Table 2. The optical density was determined with Macbeth TD-904 (a product of Macbeth Co.). In this connection, the peel layer was used to improve the transfer ability of the image.

TABLE 1

| Coating liquid for forming color photosensitive resin layer | Y | M | C | B |
| --- | --- | --- | --- | --- |
| Benzylmethacrylate/methacrylic acid copolymer (molar ratio: 73/27, η:0.12) | 60.0 g | 60.0 g | 60.0 g | 60.0 g |
| Pentacrythritol tetraacrylate | 43.2 g | 43.2 g | 43.2 g | 43.2 g |
| Michler's ketone | 2.4 g | 2.4 g | 2.4 g | 2.4 g |
| 2-(O-Chlorophenyl)-4,5-diphenylimidazole dimer | 2.5 g | 2.5 g | 2.5 g | 2.5 g |
| Seika Fast Yellow II-0755 (a product of Dainichiseika Color & Chemicals Mfg. Co., Ltd.) | 18.8 g | — | — | — |
| Seika Fast Carmine 1483 (a product of Dainichiseika Color & Chemicals Mfg. Co., Ltd.) | — | 10.4 g | — | — |
| Cyanine Blue 4820 (a product of Dainichiseika Color & Chemicals Mfg. Co., Ltd.) | — | — | 11.2 g | — |
| Carbon Black MA-100 (a product of Mitsubishi Chemical Industries, Ltd.) | — | — | — | 13.2 g |
| Methyl cellosolve acetate | 560.0 g | 560.0 g | 560.0 g | 560.0 g |
| Methyl ethyl ketone | 280.0 g | 280.0 g | 280.0 g | 280.0 g |

Note: "η" indicates the limiting viscosity number of the solution in methyl ethyl ketone, at 25° C.

TABLE 2

| Optical density of color photo-sensitive resin layer | | |
| --- | --- | --- |
| | Filter | Optical density |
| Y | Blue filter | 1.50 |
| M | Green filter | 2.25 |
| C | Red filter | 1.95 |

TABLE 2-continued

| Optical density of color photo-sensitive resin layer | | |
| --- | --- | --- |
| | Filter | Optical density |
| K | None | 2.70 |

A coating liquid for forming the protecting layer having the following composition was applied to the color photosensitive resin layer and dried to form the protecting layer having a thickness of 1.5 μm (on dry basis):

| Coating liquid for forming protecting layer: | |
| --- | --- |
| Polyvinyl alcohol (GL-05; a product of Nippon Synthetic Chemical Industry Co., Ltd.) | 60.0 g |
| Water | 970.0 g |
| Methanol | 30.0 g |

Each of the four color image-forming materials was superposed on a corresponding color separation mask (prepared based on the original picture) with a resister pin and subjected to the image exposure with a 2 kW ultra-high pressure mercury lamp at a distance of 50 cm. The image-forming material thus exposed was developed with a developer having the following composition at 35° C. for 30 sec to form 4-colored positive images:

| Developer: | |
| --- | --- |
| $Na_2CO_3$ | 15.0 g |
| Butyl cellosolve | 1.0 g |
| Water | 1.0 l |

Then the image-forming material having the black image was precisely superposed on the image-receiving material with the resister pin so that the image-side of the material was brought into contact with the photo-polymerizable image-receiving layer of the image-receiving material. Then the lamination was conducted with a laminator (Fast Laminator 8B-550-80; a product of Taisei Shoji Co., Ltd.) under conditions comprising a pressure of 2 bar, roller temperature of 120° C. and lamination speed of 900 mm/min. After peeling off the support from the image-forming material, the black image was obtained on the image-receiving material. The same procedure as that described above was repeated with the balance (three color image-forming materials) to obtain the image-receiving material having the black, cyan, magenta and yellow images.

On the other hand, the above-described adhesive sheet was placed on a transparent polycarbonate resin plate (E-2000; a product of Mitsubishi Gas Chemical Company, Inc.; Thickness: 1.0 mm) (rigid light-transmitting permanent support) so that the photo-polymerizable adhesive layer was brought into contact with the plate and the lamination was conducted under the same conditions as those described above. Then the support was peeled off from the adhesive sheet to obtain the polycarbonate resin plate having the adhesive layer formed thereon.

Then the polycarbonate resin plate having the adhesive layer was put together with the image-receiving material having the black, cyan, magenta and yellow images transferred thereonto so that the photo-polymerizable adhesive layer was brought into contact with the image layer. The lamination was conducted under the same conditions as those described above.

The support was peeled off from the image-receiving material and the material was passed through a U.V. hardening devicve (NPT-453; a product of Nippon Bunka Seiko Co., Ltd., 80 W/cm, ozone converging type, single lamp, 2 m/min) twice (the surface and the back) to harden the photo-polymerizable adhesive layer and the photo-polymerizable image-receiving layer, thereby obtaining the meter panel.

Figure 2:
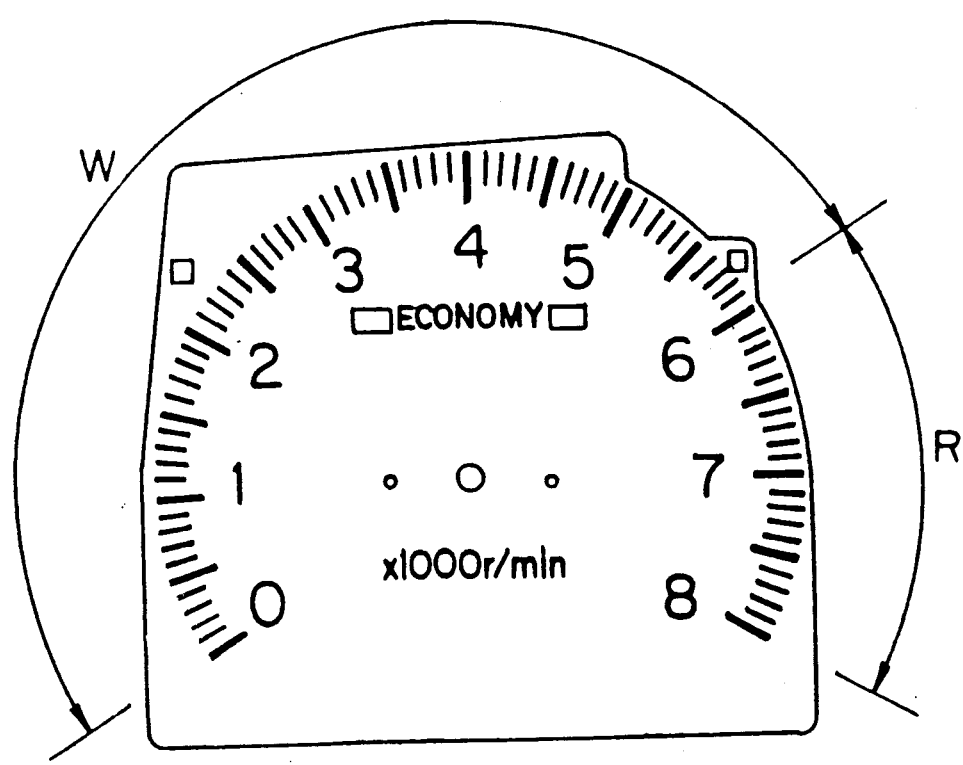
FIG. 2 shows a plane view of the meter panel.

The image strength and adhesion of the meter panel thus obtained are shown in Table 3 and a vertical cross-sectional view and plane view of the meter panel are shown in FIGS. 1 and 2. In these FIGS. 1 is a meter panel, 2 is a photo-polymerizable image-receiving layers, 3,4,5,6, are black, cyan, magenta and yellow image layers, respectively, 9 is a photo-polymerizable adhesive layer and 10 is a permanent support.

EXAMPLE 2

A liquid photo-polymerizable adhesive having the following composition was applied to a polycarbonate resin plate which was the rigid light-transmitting permanent support to form a layer having a thickness of 5 μm:

| Liquid photo-polymerizable adhesive: | |
| --- | --- |
| Trimethylolpropane triacrylate | 50.0 g |
| Neopentyl glycol diacrylate | 50.0 g |
| Irgacure 651 (a product of Ciba-Geigy) | 5.0 g |

The image layer of the image-receiving material having the black, cyan, magenta and yellow color separation images formed in the same manner as that of Example 1 was superposed on the liquid adhesive layer of the polycarbonate and they were pressed with a roller so that no bubbles were formed between them.

After the U.V. hardening conducted under the same conditions as those of Example 1, the support was peeled off from the image-receiving material to obtain the meter panel.

The image strength and adhesion of the obtrained meter panel are shown in Table 3.

COMPARATIVE EXAMPLE 1

An image-receiving material having black, cyan, magenta and yellow images transferred thereonto prepared in the same manner as that of Example 1 was superposed on a polycarbonate resin plate which was a rigid light-transmitting permanent support so that the plate is brought into contact with the image layer. The lamination was conducted under the same conditions as those of Example 1 to form a laminate.

After the U.V. hardening conducted under the same conditions as those of Example 1, the support was peeled off from the image-receiving material to obtain the meter panel.

The image strength and adhesion of the obtained meter panel are shown in Table 3.

COMPARATIVE EXAMPLE 2

A polycarbonate resin plate which was the rigid light-transmitting permanent support was laminated with a heat-sensitive adhesive sheet under the same conditions as those of Example 1. The image-receiving material having the black, cyan, magenta and yellow images transferred thereonto prepared in the same manner as that of Example 1 was placed on the polycarbonate resin plate so that the image layer was brought into contact with the heat-sensitive adhesive sheet. The lamination was conducted under the same conditions as those of Example 1 to form a laminate.

After the U.V. hardening conducted under the same conditions as those of Example 1, the support was peeled off from the image-receiving material to obtain the meter panel.

The image strength and adhesion of the obtained meter panel are shown in Table 3.

TABLE 3

| | Adhesion of meter panel | | |
| --- | --- | --- | --- |
| | Pencil hardness | Adhesion | High-temperature and high-humidity properties |
| Example 1 | 3H | A | A |
| Example 2 | 3H | A | A |
| Comp. Ex. 1 | Less than 2B | E | D |
| Comp. Ex. 2 | Less than 2B | C | C |

Pencil hardness:
  The pencil hardness was determined according to JIS D-0212.
Adhesion:
  The image on the meter panel was cross-cut to form squares (1 mm × 1 mm) with an NT cutter, it was peeled off with Nitto Polyester adhesive tape (No. 31; a product of Nitto Denko Co., Ltd.) and the degree of the image remaining on the support was examined according to JIS D-0202.
  A: No peeling (100/100)
  B: Peeling was observed in the cut portion.
  C: 70/100 or above
  D: 69/100 to 30/100
  E: 29/100 or less
High-temperature and high-humidity properties:
  The image on the meter panel was cross-cut to form squares (1 mm × 1 mm) with an NT cutter and it was left to stand at 60° C. at a relative humidity of 95% for 120 h. The peeling off and expansion in the image part were examined.
  A: Neither peeling nor expansion was observed.
  B: Expansion was observed in the cut portion.
  C: Expansion was observed in not only the cut portion.
  D: Expansion was observed all over the surface.
  E: Image was peeled off.
What is claimed is:

1. A display which comprises a color image forming layer provided on a light-transmitting permanent support via a photo-polymerizable adhesive layer, and a photo-polymerizable image-receiving layer closely adhered to the color image forming layer.

2. The display of claim 1 wherein the color image forming layer is formed by laminating, one after another, a transparent peel layer and an image layer comprising a single colored dot image.

3. The display of claim 2 wherein the color image forming layer comprises yellow, cyan, magenta and black layers and the peel layer is provided therebetween, respectively.

4. A process for producing a display which comprises the steps of forming a color image on a photo-polymerizable image-receiving layer of a photosensitive image-receiving material, placing it upon a photo-polymerizable adhesive layer formed on a light-transmitting permanent support to form a laminate so that the photo-polymerizable image-receiving layer and the photo-polymerizable adhesive layer face each other and then exposing the laminate to light so as to closely adhere the photo-polymerizable image-receiving layer and the photo-polymerizable adhesive layer to their adjacent layers, respectively, by the photo-polymerization.

5. The process according to claim 4 which comprises the following steps (a) to (f):
  (a) image-exposing a photosensitive image-forming material through a color separation mask, the photosensitive image-forming material comprising, on a support, (1) a photosensitive colored composition containing a dye or pigment or (2) a laminate of a color material layer containing a dye or pigment and a photosensitive resist layer, wherein the layer (1) or (2) is directly formed on the support or formed on the support via a peel layer,
  (b) developing the image-exposed photosensitive image-forming material to form a color image on the support,
  (c) transferring the color image onto the photo-polymerizable image-receiving layer of the image-receiving material,
  (d) transferring at least one more color image having a different color formed in the same manner as that of the above step (a) or (b) onto the photo-polymerizable image-receiving layer in conformity to each other,
  (e) transferring the multi-color image formed on the image-receiving layer onto the light-transmitting permanent support having the photo-polymerizable adhesive layer, and
  (f) photo-polymerizing the photo-polymerizable image-receiving layer on the image-receiving material and the photo-polymerizable adhesive layer on the light-transmitting permanent support by exposure to light.

6. The process according to claim 4 wherein the photo-sensitive adhesive layer is formed from a dry film-type photo-polymerizable adhesive.

7. The process according to claim 6 wherein the dry film-type photo-polymerizable adhesive comprises
  (a) a non-gaseous ethylenically unsaturated compound having at least one ethylenically unsaturated group and capable of forming a polymer in the presence of a photo-polymerization initiator,
  (b) a thermoplastic organic polymer binder, and
  (c) a photo-polymerization initiator or initiator system which is activated by activating rays.

8. The process according to claim 6 wherein the dry film-type photo-polymerizable adhesive is kept on a temporary support by adhesion thereto prior to the adhesion to the photo-transmitting permanent support.

9. The process according to claim 4 wherein the photosensitive adhesive layer is formed from a liquid photo-polymerizable adhesive.

10. The process according to claim 9 wherein the liquid photo-polymerizable adhesive is a solventless composition containing
  (i) a non-gaseous ethylenically unsaturated compound having at least one ethylenically unsaturated group and capable of forming a polymer in the presence of a photo-polymerization initiator,
  (ii) a photo-polymerization initiator or initiator system which is activated by activating rays.

11. The process according to claim 4 wherein the photo-polymerizable adhesive layer has a thickness of 2.0 to 50.0 μm.

12. The process according to claim 4 wherein the photo-polymerizable image-receiving layer has a thickness of 4 g/m² to 40 g/m².

13. The process according to claim 4 wherein the light-transmitting permanent support is a rigid plastic plate.

14. The process according to claim 9 wherein the rigid plastic plate is a polycarbonate plate, acrylic resin plate or polyvinyl chloride plate.

15. The process according to claim 4 wherein the light-transmitting permanent support has a thickness of 0.1 to 5 mm.

16. The process according to claim 5 wherein step (c) is carried out by directly superposing a separated image of first color obtained in step (b) onto the photo-polymerizable image-receiving layer of the image-receiving material and passing it through a laminator under heating and pressure so as to transfer the separated image to the photo-polymerizable image-receiving layer such that the image is formed on the layer.

17. The process according to claim 5 wherein step (d) is carried out by successively conforming second and other separated images to the image of a first color and transferring them to photo-polymerizable image-receiving layer such that the images are formed on the layer.

18. The process according to claim 4 which comprises the following steps (a) to (f):
  (a) image-exposing a photosensitive image-forming material through a color separation mask, the photosensitive image-forming material comprising, on a support, (1) a photosensitive colored composition containing a dye or pigment or (2) a laminate of a color material layer containing a dye or pigment and a photosensitive resist layer wherein the layer (1) or (2) is directly formed on support or formed on the support via a peel layer,
  (b) developing the image-exposed photosensitive image-forming material to form a first color image on the support,
  (c) directly superposing a separated image of the first color onto the photo-polymerizable image-receiving layer of the image-receiving material and passing them through a laminator under heating and pressure so as to transfer the separated image to the photo-polymerizable image-receiving layer in such a state that the image is formed on the layer by the heat and pressure applied thereto during the passage, (d) successively conforming second and other separated images as necessitated to the image of the first color and then transfering them in the same manner in step (c) to form a multi-color separated image on the photo-polymerizable image-receiving layer, (e) directly superposing a photo-polymerizable composition layer of a dry film-type photo-polymerizable adhesive onto the light-transmitting permanent support and passing them through the laminator under heating and pressure to adhere the photo-polymerizable adhesive layer to the light-transmitting permanent support, (f) directly superposing the photo-polymerizable image-receiving layer onto the photo-polymerizable adhesive layer on the light-transmitting permanent support and passing them through the laminator under heating and pressure to adhere the photo-polymerizable image-receiving layer having the multi-color separated image transferred thereonto to the light-transmitting permanent support, (g) wholly irradiating with U.V. rays to photo-polymerize the photo-polymerizable adhesive layer and the photo-polymerizable image-receiving layer, and (h) optionally, peeling of the transparent support for the photo-polymerizable image-receiving layer to obtain the conformed separated image having an excellent adhesion which has been transferred onto the light-transmitting permanent support.

* * * * *